United States Patent
Haiberger et al.

(10) Patent No.: US 9,741,910 B1
(45) Date of Patent: Aug. 22, 2017

(54) OPTOELECTRONIC COMPONENT

(71) Applicant: OSRAM Opto Semiconductors GmbH, Regensburg (DE)

(72) Inventors: Luca Haiberger, Regensburg (DE); Michael Wittmann, Alteglofsheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/119,503

(22) PCT Filed: Feb. 18, 2015

(86) PCT No.: PCT/EP2015/053408
§ 371 (c)(1),
(2) Date: Aug. 17, 2016

(87) PCT Pub. No.: WO2015/124621
PCT Pub. Date: Aug. 27, 2015

(30) Foreign Application Priority Data

Feb. 21, 2014 (DE) .................. 10 2014 102 258

(51) Int. Cl.
*H01L 33/00* (2010.01)
*H01L 33/56* (2010.01)
(Continued)

(52) U.S. Cl.
CPC ............ *H01L 33/56* (2013.01); *H01L 33/465* (2013.01); *H01L 33/48* (2013.01); *H01L 33/483* (2013.01);
(Continued)

(58) Field of Classification Search
None
See application file for complete search history.

(56) References Cited

U.S. PATENT DOCUMENTS

2003/0080341 A1* 5/2003 Sakano .................. B29C 67/08
257/79
2006/0214562 A1* 9/2006 Chang ................ C09K 11/7774
313/503

(Continued)

FOREIGN PATENT DOCUMENTS

DE   10 2009 055 786 A1   5/2011
DE   10 2011 116 752 A1   4/2013
DE   10 2012 103 159 A1   10/2013

*Primary Examiner* — Minh-Loan Tran
(74) *Attorney, Agent, or Firm* — DLA Piper LLP (US)

(57) ABSTRACT

An optoelectronic component includes a housing having a cavity in which an optoelectronic semiconductor chip having an emission face that emits light rays and a transparent potting material are arranged, wherein the cavity includes at least one side wall at least partly reflecting light rays incident on the side wall and reflectivity of which decreases as an operating period of the component increases, conversion particles are embedded into the potting material, which conversion particles convert light rays having a first wavelength incident on the conversion particles into light rays having a second wavelength, and scattering particles are embedded into the potting material, which scattering particles scatter light rays incident on the scattering particles and the scattering capability of which scattering particles increases as the operating period increases.

14 Claims, 2 Drawing Sheets

(51) Int. Cl.
  *H01L 33/48*  (2010.01)
  *H01L 33/46*  (2010.01)
  *H01L 33/50*  (2010.01)
  *H01L 33/54*  (2010.01)

(52) U.S. Cl.
  CPC ............ *H01L 33/486* (2013.01); *H01L 33/50* (2013.01); *H01L 33/502* (2013.01); *H01L 33/504* (2013.01); *H01L 33/507* (2013.01); *H01L 33/508* (2013.01); *H01L 33/54* (2013.01); *H01L 2933/0091* (2013.01)

(56) References Cited

U.S. PATENT DOCUMENTS

| | | |
|---|---|---|
| 2009/0160330 A1 | 6/2009 | Hsu et al. |
| 2009/0173957 A1* | 7/2009 | Brunner ............. C09K 11/7701 257/98 |
| 2012/0273811 A1 | 11/2012 | Kräuter et al. |
| 2014/0264422 A1 | 9/2014 | Windisch et al. |
| 2015/0076544 A1 | 3/2015 | Schmidtke et al. |

* cited by examiner

OPTOELECTRONIC COMPONENT

TECHNICAL FIELD

This disclosure relates to an optoelectronic component.

BACKGROUND

Optoelectronic components, for example, light-emitting diode components that emit white or different-colored light are known. It is further known to equip such components with optoelectronic semiconductor chips that generate electromagnetic radiation. By way of example, light-emitting diode chips that emit radiation in a specific wavelength range, for example, in the blue spectral range may be used here.

The optoelectronic semiconductor chip is usually arranged in a cavity of a housing, for instance of a plastic housing. The side walls of the cavity may be configured to reflect the electromagnetic radiation emitted by the optoelectronic semiconductor chip and thus to support a directional emission into a defined solid angle range.

To generate a wide emission spectrum, for example, a white light spectrum, optoelectronic components typically comprise converter elements. The latter are configured to convert radiation in a first wavelength range emitted by the optoelectronic semiconductor chip into radiation in a second wavelength range. For this purpose, generally conversion particles are embedded into a transparent potting material arranged in the cavity of the housing and may contain, for example, a polymer such as a silicone or an epoxy.

The conversion particles usually comprise a luminescent dye. The wavelength conversion is then realized by absorption of electromagnetic radiation having a first wavelength and the subsequent emission of radiation having a second, usually higher, wavelength. A plurality of different conversion particles that absorb and/or emit in different wavelength ranges may also be used.

The total spectrum of radiation emitted by the optoelectronic component is thus determined by the emission spectrum of the optoelectronic semiconductor chip itself, and by the number of the conversion particles used. In accordance with the color impression perceived by an observer, a color locus in a suitable color space may be assigned to the emitted spectrum.

Aging processes of the materials used in the construction of the optoelectronic component may lead to an alteration of the emission characteristic of the optoelectronic component over the lifetime of the component. The light intensity emitted for a given operating current typically decreases as the optoelectronic component increasingly ages. The lifetime of the component may then be defined as the operating period during which the emitted light intensity falls on average to, for example, 50% of the initial intensity.

Furthermore, aging of the optoelectronic component often leads to a change in the emitted electromagnetic spectrum and thus to a change in the color locus. Such a color locus shift is primarily undesired in applications requiring a color-stable emission such as, for example, in the backlighting of LCD screens. Heretofore, a color locus shift has primarily been counteracted by the use of materials whose optical properties change as little as possible during the operating period, for example, suitable silicones. Processing of these materials is often comparatively complex, which may cause high production costs and limit the producibility of miniaturized designs.

It could therefore be helpful to provide an improved optoelectronic component in which in particular the color locus of the emitted electromagnetic radiation remains as constant as possible over the lifetime of the optoelectronic component, which allows in particular the smallest possible designs and/or which in particular is particularly cost-effective to produce.

SUMMARY

We provide an optoelectronic component including a housing having a cavity in which an optoelectronic semiconductor chip having an emission face that emits light rays and a transparent potting material are arranged, wherein the cavity includes at least one side wall at least partly reflecting light rays incident on the side wall and reflectivity of which decreases as an operating period of the component increases, conversion particles are embedded into the potting material, which conversion particles convert light rays having a first wavelength incident on the conversion particles into light rays having a second wavelength, and scattering particles are embedded into the potting material, which scattering particles scatter light rays incident on the scattering particles and the scattering capability of which scattering particles increases as the operating period increases.

BRIEF DESCRIPTION OF THE DRAWINGS

FIGS. 1 and 2 show a sectional side view of an optoelectronic component, wherein FIG. 1 shows the component after a first operating period and FIG. 2 shows the component after a second operating period.

LIST OF REFERENCE SIGNS

Figure 1:
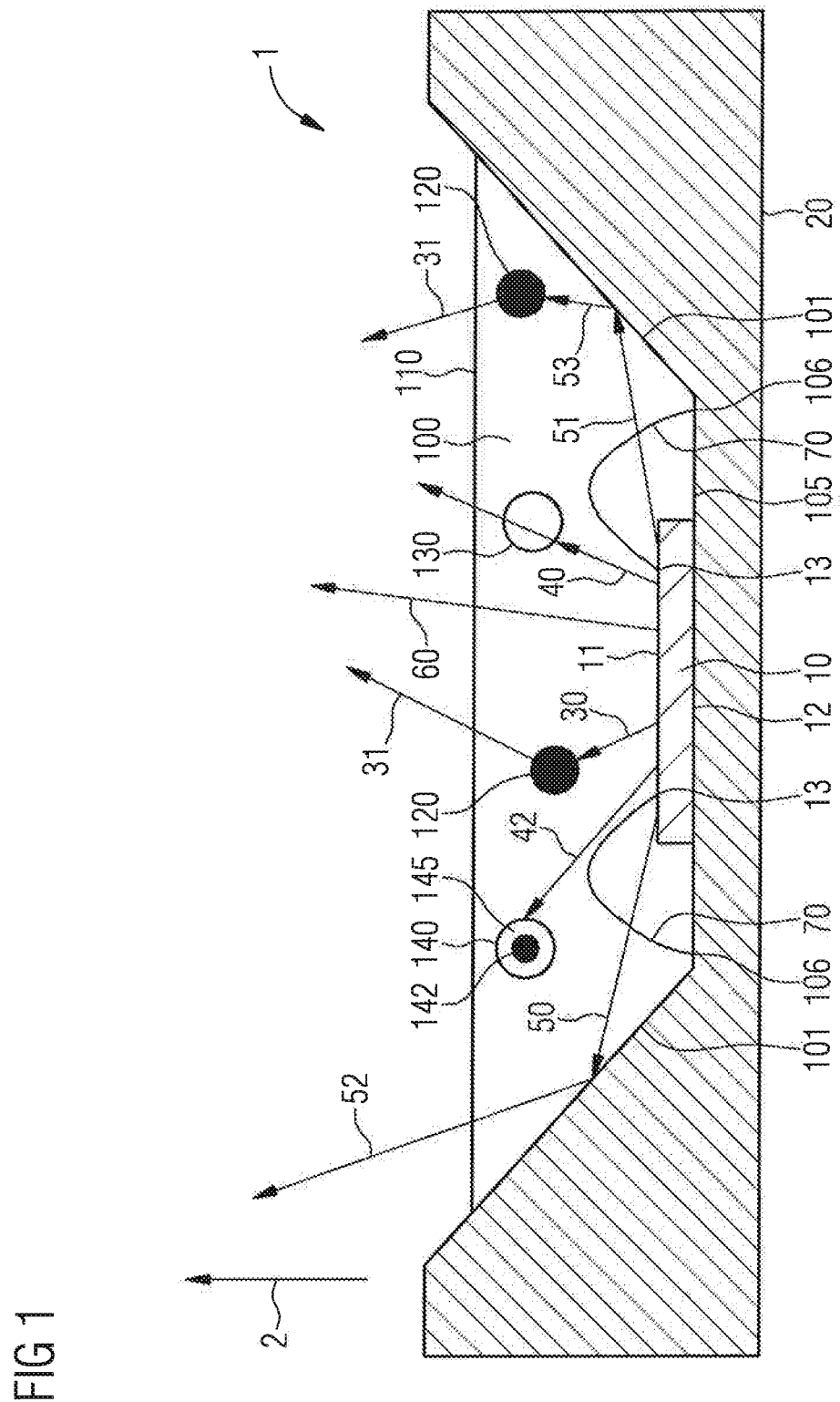

1 Optoelectronic component
2 Emission direction
10 Optoelectronic semiconductor chip
11 Emission face
12 Underside
13 Contact pad on the optoelectronic semiconductor chip
20 Housing
30 Light ray incident on conversion particle
Converted light ray
40 Light ray incident on scattering particle
Scattered light ray
42 Further light ray incident on scattering particle
50 Light ray incident on side wall
51 Light ray incident on side wall
52 Reflected light ray
53 Reflected light ray incident on conversion particle
60 Directly emitted light ray
70 Contact element
100 Cavity
101 Side walls
102 Aged side walls
105 Bottom of cavity
106 Contact pad at bottom of cavity
110 Potting material
120 Conversion particle
130 Single-component scattering particle
131 Aged single-component scattering particle
140 Two-component scattering particle
141 Aged two-component scattering particle
142 Catalyst
145 Encapsulation
146 Aged encapsulation

DETAILED DESCRIPTION

Our optoelectronic component comprises a housing having a cavity in which an optoelectronic semiconductor chip having an emission face that emits light rays and also a transparent potting material are arranged. In this case, the cavity comprises at least one side wall at least partly reflecting light rays incident on the side wall and the reflectivity of which decreases as the operating period increases. Conversion particles are embedded into the potting material, which conversion particles convert light rays having a first wavelength incident on the conversion particles into light rays having a second wavelength. In addition, scattering particles are embedded into the potting material, which scattering particles scatter light rays incident on the scattering particles and the scattering capability of which scattering particles increases as the operating period increases.

Arranging the optoelectronic semiconductor chip in a cavity having an at least partly reflective side wall advantageously enables the electromagnetic radiation emitted by the optoelectronic semiconductor chip to be emitted directionally into a defined solid angle range. By additionally embedding conversion particles into the transparent potting material, it is possible for the color locus of the emitted radiation advantageously to be adapted in a targeted manner to the purposes of use of the optoelectronic component.

Adding scattering particles, the scattering capability of which likewise increases as the operating period increases, advantageously makes it possible to counteract a shortening of the average optical path length in the potting material on account of decreasing reflectivity of the side wall of the cavity as the operating period increases. As a result, the probability with which emitted photons having a first wavelength are converted into photons having a second wavelength by a conversion particle may be prevented from changing significantly during the operating period of the component.

This has the advantage that the color locus of the radiation emitted by the optoelectronic component is likewise subjected to a smaller fluctuation as the operating period increases. By virtue of the fact that the scattering particles are introduced into the potting material in the form of separate particles, by the concentration thereof the increase in the scattering capability may advantageously be adapted to the decrease in the reflectivity of the side wall.

The conversion particles may be configured to convert incident light rays having a relatively short wavelength into light rays having a relatively long wavelength. As a result, to generate light having a wide spectrum in the visible spectral range, in particular to generate white light, it is advantageously possible to use optoelectronic semiconductor chips that primarily emit visible light in the blue spectral range. The optoelectronic semiconductor chips have a high efficiency compared to optoelectronic semiconductor chips having higher emission wavelengths.

The scattering particles may be configured such that the temporal increase in the scattering capability depends on the effect on the scattering particles manifested by short-wave electromagnetic radiation, in particular UV radiation, and/or heat and/or moisture. As a result, it is advantageously possible to adapt the increase in the scattering capability to the decrease in the reflectivity of the side wall particularly simply since the latter may likewise primarily be caused by the effect of short-wave radiation and/or heat and/or moisture. A color locus shift caused by reduction of the average path length of photons in the potting material can thereby be compensated for over an advantageously long period of time.

The scattering particles may be configured to develop hollow spaces that increase the scattering capability as the operating period increases. As a result, scattering particles whose scattering capability increases as the operating period increases can be realized in an advantageously simple manner.

The scattering particles may comprise a silicone, preferably a phenylsilicone. Since these materials form hollow spaces, in particular microscopic cracks, under the influence of short-wave electromagnetic radiation and/or heat and/or moisture, it is thus advantageously possible to produce scattering particles for which an increase in the scattering capability is adapted to the temporal profile of the decrease in the reflectivity of the side wall.

The potting material may comprise a silicone, preferably a methylsilicone. As a result, the conversion and scattering particles may advantageously be embedded into a material whose transparency is maintained over a long operating period, for example, over 10 000 to 100 000 hours, compared to other materials. Moreover, the high thermal and UV stability of silicones advantageously enables a high operating temperature of the optoelectronic component and thus the emission of light having a high intensity.

Both the scattering particles and the potting material may comprise a silicone, wherein the refractive index of the silicone of the scattering particles is higher than the refractive index of the silicone of the potting material. As a result, it is advantageously possible to produce a potting composition consisting of the scattering particles and the potting material, the scattering capability of which increases as a result of aging of the silicone of the scattering particles as the operating period increases on account of formation of microscopic cracks. By adapting the concentration of the scattering particles in the potting material, the scattering capability may additionally be coordinated with the decrease in the reflectivity of the side wall.

The scattering particles may comprise a polymer. This preferably involves a transparent polymer such as PMMA. As a result, it is possible in a simple manner to produce scattering particles whose scattering capability increases as the operating period increases, for example, as a result of formation of microscopic cracks or chalking of particles incorporated into the polymer under the influence of radiation and/or heat and/or moisture.

The scattering particles may be of multi-component design and comprise a catalyst and a transparent encapsulation, wherein the encapsulation at least partly surrounds the catalyst, and wherein the catalyst is configured to support decomposition of the encapsulation under the influence of short-wave electromagnetic radiation, in particular UV radiation, and/or heat and/or moisture.

In the decomposition of the transparent encapsulation, an increasing scattering capability as the operating period increases is advantageously achieved by cracking or chalking of particles contained in the encapsulation. The choice of a suitable catalyst material advantageously additionally makes it possible to match the increase in the scattering capability under the influence of radiation and/or heat and/or moisture to the decrease in the reflectivity of the side wall of the cavity and to keep constant the average optical path length in the potting material.

The catalyst may comprise $TiO_2$. As a photocatalyst, $TiO_2$ advantageously supports decomposition of a suitable encapsulation material surrounding the catalyst under the influence of electromagnetic radiation, in particular under the influence of electromagnetic radiation from the UV range or visible, blue wavelength range. As a result, an increase in the scattering capability owing to decomposition and chalking of the encapsulation can advantageously be adapted particularly precisely to the decrease in the reflectivity of the side wall.

The encapsulation may comprise a plastic, preferably a polymer. As a result, an encapsulation whose decomposition under the influence of radiation and/or heat and/or moisture is supported by a suitable catalyst material can be realized in a simple and cost-effective manner.

The scattering particles may comprise a size of 1 nm to 100 μm. The scattering particles are thus advantageously small enough to be able to be admixed with the potting material in large numbers in typical housing sizes and to have a high scattering capability.

The concentration of the scattering particles in the potting material may be chosen such that, as the operating period of the optoelectronic component increases, a reduction in the average path length of a photon in the potting material on account of the decrease in the reflectivity of the side wall is counteracted by the simultaneous increase in the scattering capability of the scattering particles, and the color locus of the radiation emitted by the optoelectronic component changes by at most 5% during the lifetime of the optoelectronic component. As a result, it is possible to produce an optoelectronic component comprising an advantageously small color locus shift during the entire lifetime of the component.

The housing may comprise a plastic, preferably a polyphthalamide or PCT (polycyclohexylene dimethylene terephthalate). As a result, it is advantageously possible to produce a housing that is simple and cost-effective to produce. Moreover, plastics materials such as, for example, thermoplastics such as polyphthalamides are suitable for fabrication by injection molding or transfer molding methods and in this case at the same time make it possible to produce advantageously small designs.

The above-described properties, features and advantages and the way in which they are achieved will become clearer and more clearly understood in association with the following description of the examples explained in greater detail in association with the drawings.

Optoelectronic semiconductor chips, for example, light-emitting diode chips (LED chips), are typically used in optoelectronic components to generate light. The chips are potted in a housing that offers protection against environmental influences and mechanical influences. As a result, the components have a high mechanical stability and particularly compact through to miniaturized designs are possible. Compared to conventional lighting elements such as fluorescent lamps, for instance, optoelectronic components have, inter alia, the advantage of a long lifetime, a low operating voltage and a low power consumption.

On account of these advantages one field of application of such optoelectronic components is the backlighting of LCD screens. As a result of the low power consumption and small structural size, they are primarily also suitable for use in mobile, battery-operated devices. If LED elements are used for backlighting, then a constant color locus of the emitted light is necessary to ensure a screen output with color fidelity over the entire lifetime of the LED element.

FIG. 1 shows a lateral sectional view of an optoelectronic component 1. The latter consists of a housing 20 having a cavity 100, on the bottom of which is arranged an optoelectronic semiconductor chip 10. The latter may be, for example, a light-emitting diode chip (LED chip), while the housing 20 may comprise, for example, a plastics material, for instance a thermoplastic such as polyphthalamide.

In addition, the cavity 100 is filled with a transparent potting material 110 that contains, for example, a methylsilicone, an epoxy or a silicone-epoxy hybrid material. In the example illustrated, the potting material 110 completely surrounds the optoelectronic semiconductor chip 10.

The optoelectronic semiconductor chip 10 comprises an emission face 11 arranged at the top side of the semiconductor chip 10. The emission face 11 is configured to emit electromagnetic radiation. This preferably involves radiation from the visible, blue spectral range. Since optoelectronic semiconductor chips such as LED chips, for example, generally emit in a comparatively narrow spectral range, conversion particles 120 are additionally incorporated into the potting material 110. The conversion particles convert the color of an incident light ray 30 into a second color of a converted light ray 31, which may be in the yellow optical wavelength range, for example. For this purpose, the conversion particles 120 may comprise a luminescent dye, for example, that absorbs incident light and re-emits it in a color-shifted fashion.

In the example illustrated, light emitted by the optoelectronic component 1 is principally composed of two spectral components. The latter first involves spectral distribution of a light ray 60 emitted directly by the optoelectronic semiconductor chip 10. A second component is determined by the emission spectrum of the conversion particles 120. Advantageously, a Stokes shift of the incident light ray 30 from relatively short to relatively long wavelengths takes place in the conversion. However, other conversion processes and also conversion processes from relatively long to relatively short wavelengths, for example, two-photon processes are also possible.

By the type and composition of the conversion particles 120 and also the density thereof in the potting material 110, it is possible to influence the optical spectrum or the color locus of the light emitted by the optoelectronic component 1. In this regard, it is possible to produce, for example, optoelectronic components configured to emit light in a relatively wide spectral range, in particular white light. For a more precise adaptation to possible applications, it is also possible to introduce a plurality of different types of conversion particles in different concentrations, for example.

The cavity 100 is laterally delimited by side walls 101, which may be inclined, for example, such that the cavity 100 tapers in a direction of a bottom 105 of the cavity. However, other examples are also possible, for example, perpendicular or curved side walls. The side walls 101 are configured to reflect or scatter incident light. In the example illustrated, together with the inclined example of the side walls 101, a reflector arises which concentrates the light emitted by the optoelectronic semiconductor chip 10 in an emission direction 2. In general, the side faces 101 in this case function as Lambertian emitters and reflect an incident light ray 50 diffusely.

After reflection, a light ray 50 incident on the side wall may emerge from the optoelectronic component as a reflected light ray 52. Before emerging, however, conversion of a second reflected light ray 53 by one of the conversion particles 120 may also occur, as in a second light ray 51 incident on one of the side walls 101.

In general, the properties of the emitted light vary as the operating period of the optoelectronic component 1 increases, as a result of aging. In this case, the operating period is the period of time over which the optoelectronic component 1 has been in operation overall at a specific point in time since its production. As the operating period increases, for example, the intensity of the emitted light for a given operating current may decrease such that the lifetime may be defined as the operating period after which the intensity of the emitted light falls below a predefined value for a specific percentage of all optoelectronic components under consideration. In this regard, for example, there are customary definitions stipulating that after the end of the lifetime in 50% of all the optoelectronic components of a population the emitted light intensity has fallen to below 50% or 70% of the initial intensity (L50B50 and L70B50, respectively).

Primarily, the housing material is subjected to aging effects since aging-resistant materials such as silicones, for example, may not be used here, under certain circumstances, for technical reasons appertaining to process engineering and/or costs. This is the case particularly for small designs produced using the injection molding or transfer molding method.

Causes of aging may be, for example, the influence of short-wave electromagnetic radiation or heat or moisture. In particular, UV radiation and the heat loss of the optoelectronic semiconductor chip 10 generated during operation lead to aging.

As a result, the lifetime of the optoelectronic component 1 is greatly dependent on the specific technical shaping and is determined inter alia by the possibility of dissipating heat from the optoelectronic semiconductor chip 10 or protecting the component against moisture. Typical lifetimes are in the range of 10 000 to 100 000 hours, wherein relatively small designs more likely have a lifetime of 15 000 hours, for instance, and relatively large designs more likely have a lifetime of 35 000 hours, for instance.

In housings composed of polymers, primarily the influence of visible blue and ultraviolet radiation may lead to an alteration of the polymer matrix. As a consequence, in particular the reflectivity of the side walls 101 also decreases. Since this generally does not take place to the same extent for all wavelength ranges of the light, a discoloration of the side walls 101 results therefrom. By way of example, the side walls 101 would appear yellowish or brownish in the case of a reduction of the reflectivity in the blue spectral range.

As a result of a decrease in reflectivity of the side walls 101, the average path length covered by the light rays emitted by the optoelectronic semiconductor chip 10 in the potting material 110 decreases as well. In particular, there are fewer light rays that, after a reflection at the side walls 101, propagate further through the potting material 110 and are possibly converted into light rays having a longer wavelength.

This results in a shift in the color locus of the light emitted by the optoelectronic component 1 since, in the case of a shorter path length in the potting material 110, the probability with which one of the light rays 30, 40, 42, 50, 51 or 60 emitted by the optoelectronic semiconductor chip 10 impinges on one of the conversion particles 120 decreases as well. When the conversion particles 120 emit luminescent radiation in the yellow spectral range, the spectrum of the light emitted overall shifts, for example, to blue wavelengths (blue shift). In general, this effect predominates over a color locus shift caused by a smaller proportion of light rays emerging directly from the housing after reflection.

By way of example, in an optoelectronic component that emits white light, the color locus in the CIE xy chromaticity diagram may be governed by the pair of coordinates (Cx, Cy)=(0.30; 0.29). Typical absolute color locus shifts over the lifetime of the component lead to a change in one or both color coordinates Cx and Xy by 0.03 to 0.05.

A decrease in the intensity of the light emitted by the optoelectronic component 1 may be compensated for in a simple manner by increasing the radiation power of the optoelectronic semiconductor chip 10. Hitherto it has been possible to counteract a color locus shift as a result of aging principally by using aging-resistant housing materials such as silicones, for example. Besides the high costs, those materials have the disadvantage compared to the otherwise customary polymers that they are not suitable for miniaturized designs usually produced using the injection molding or transfer molding method.

Figure 2:
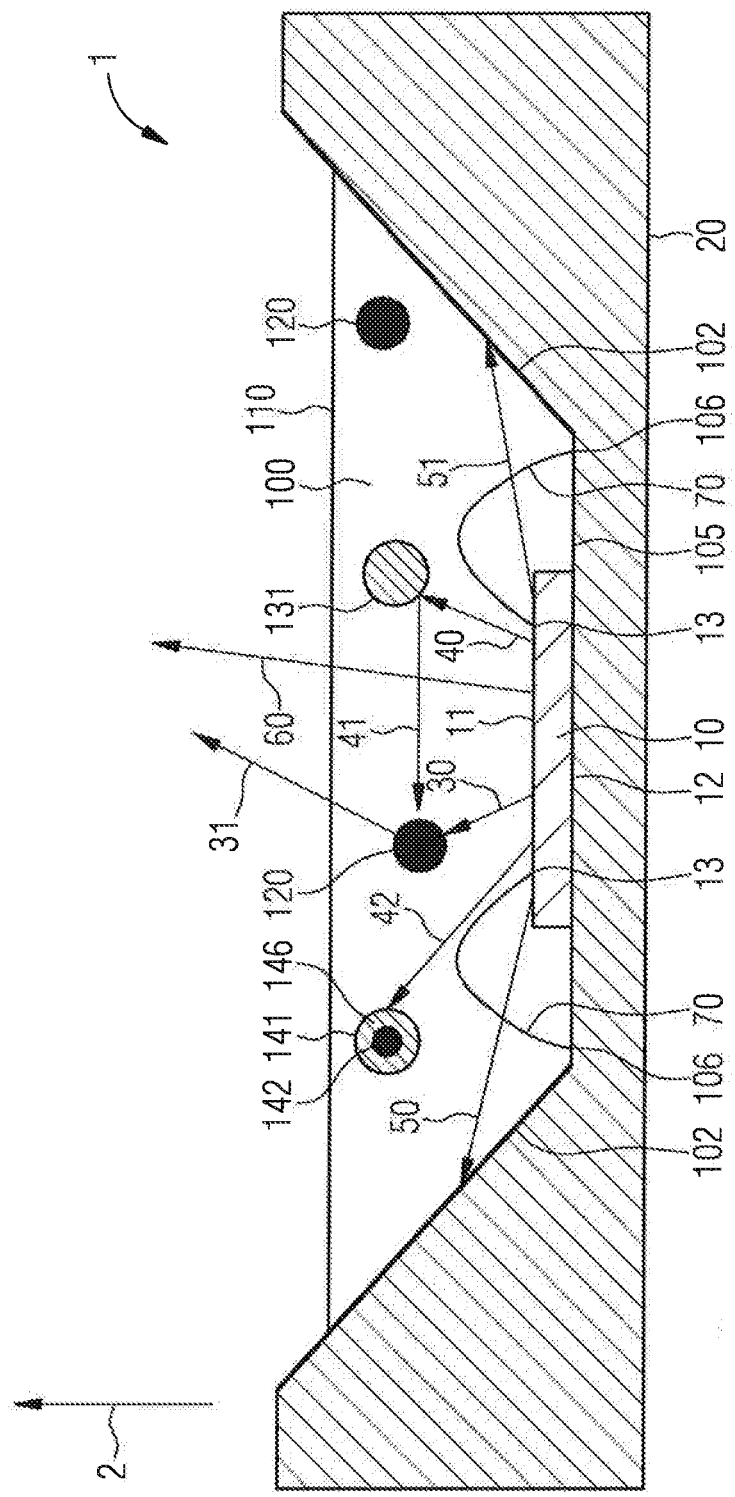

A color locus shift owing to aging may also be counteracted by our embedding into the potting material 110 additional scattering particles, the scattering capability of which increases during the operating time. Such scattering particles may be, for example, single-component scattering particles 130 and/or multi-component scattering particles 140; both variants are illustrated in FIGS. 1 and 2. At the beginning of the lifetime of the optoelectronic component 1, the single-component scattering particles 130 and/or multi-component scattering particles 140 appear transparent, for example, such that incident light rays 40, 42 may pass through them almost without a change in direction, apart from a refraction at entrance and emission faces. This situation corresponds to the illustration in FIG. 1.

FIG. 2 illustrates the same optoelectronic component 1 at a later point in time within its lifetime. As a result of the reduced reflectivity of aged side walls 102, the light rays 50, 51 incident on the latter are no longer reflected, but rather absorbed. Without the single-component scattering particles 130 and/or multi-component scattering particles 140, less light would impinge on the conversion particles 120, the proportion of converted radiation in the entire emission spectrum would decrease and the color locus of the light emitted by the optoelectronic component 1 would shift.

This is prevented by an increased scattering capability of the aged single-component scattering particles 131 and/or multi-component scattering particles 141. By way of example, the light ray 40 incident on one of the aged single-component scattering particles 131 is no longer transmitted, but rather scattered laterally into the potting material 110. Likewise, the scattering capability of the aged encapsulation 146 of an aged multi-component scattering particle 141 increases.

As a result of the associated increase in the path length in the potting material 110, the probability of a light ray 41 scattered in this way impinging on one of the conversion particles 120 and a converted light ray 31 being emitted increases as well. At an earlier point in time, the light ray 40, as illustrated in FIG. 1, would have been transmitted by one of the even less aged single-component scattering particles 130 without subsequent conversion.

In general, the decrease in reflectivity of the side walls 101 over the lifetime of the optoelectronic component 1 is dependent on the manifested influence of radiation, heat and/or moisture. Therefore, it is advantageous if the single-component scattering particles 130 and/or multi-component scattering particles 140 are configured such that the increase in the scattering capability is likewise dependent on these parameters.

This may be achieved, for example, by virtue of the fact that the initially transparent single-component scattering particles 130 and/or multi-component scattering particles 140 form hollow spaces as the operating period increases. In this case, the dimensions of such hollow spaces may be in the nanometers range, for example. Such microporous particles have an increased scattering capability on account of their larger surface area compared to solid particles of the same material. Suitable materials that form microscopic hollow spaces under the influence of heat and/or moisture, but primarily under the influence of blue or ultraviolet light, would be, for example, polymers such as PVC, PP, PE or PMMA, and also specific silicones, for instance phenylsilicones.

If the single-component scattering particles 130 and/or multi-component scattering particles 140 comprise a silicone and if the potting material 110 likewise comprises a silicone, then preferably different silicones are used for the scattering particles 130, 140 and the potting material 110. The scattering particles 130, 140 might comprise, for example, a silicone having a relatively high refractive index, for instance a phenylsilicone. These materials age comparatively rapidly and form microscopic hollow spaces in the process. The potting material 110 then preferably comprises a silicone having a relatively low refractive index, for instance a methylsilicone, which is more resistant to aging and maintains its transparency for a longer time. However, silicone particles may also be embedded into some other suitable known potting material.

So that the conversion rate in the potting material 110 is kept as constant as possible, the single-component scattering particles 130 and/or the multi-component scattering particles 140 are preferably configured such that their scattering capability increases primarily for the wavelengths of incident light converted into a different wavelength range by the conversion particles 120. The scattering rate is high primarily for structures that have approximately the same dimensions as, or smaller dimensions than, the wavelength of the incident light. If luminescent dyes are used and absorb the conversion particles 120, for example, in the blue wavelength range, the cracks that form should therefore preferably be smaller than approximately 500 nm, which may be achieved by a suitable material selection.

A further mechanism that brings about an increase in the scattering capability of the single-component scattering particles 130 and/or multi-component scattering particles 140 is chalking of extremely small particles composed of other materials incorporated into the scattering particles 130, 140. During decomposition of the material from which the scattering particles 130, 140 are fabricated, which decomposition may be caused, for example, by the influence of radiation and/or the influence of heat and/or the influence of moisture, the extremely small particles attach to the outer surface of the scattering particles 130, 140 and thus cause an increasing scattering of incident light.

Multi-component scattering particles 140 whose scattering capability increases as the operating period increases may comprise, for example, a catalyst 142 and a transparent encapsulation 145, wherein the encapsulation 145 partly or completely surrounds the catalyst 142. The catalyst 142 is preferably a photocatalyst and supports decomposition of the encapsulation 145 under the influence of light, for example, under the influence of blue light. This causes cracking or chalking of relatively small particles contained in the encapsulation 145 at the surface of the multi-component scattering particle 140 and may consequently bring about an increase in the scattering capability.

A suitable selection of the catalyst 142 makes it possible here to control the temporal profile of the decomposition process and adapt it to the decrease in the reflectivity of the side walls 101. Possible material constituents would be, for example, $TiO_2$ for the catalyst 142 and a polymer such as PMMA for the encapsulation 145. The decomposition and chalking of the encapsulation 145 advantageously leads primarily to an increase in the scattering rate in the wavelength ranges from which the conversion particles 120 primarily convert light into light having a different wavelength.

What is crucial for the best possible compensation of the color locus shift of the emitted light is the possibility of adapting the concentration and aging behavior of the single-component scattering particles 130 and/or multi-component scattering particles 140 to the envisaged operating state of the optoelectronic component 1. Primarily, the sought emission intensity and power consumption of the optoelectronic semiconductor chip 10, the heating of the optoelectronic component 1 caused as a result, and also the ambient temperature and moisture are relevant here.

The scattering particles 130, 140 are preferably uniformly and homogeneously introduced into the potting material 110. This results in an emission characteristic of the optoelectronic component 1 that is as homogeneous as possible. Given suitable coordination of the concentration of the scattering particles 130, 140 with the aging behavior of the side walls 101 and the scattering particles 130, 140 themselves, for example, a change in the coordinates of the color locus of the emitted light in the CIE xy chromaticity diagram over the lifetime of the optoelectronic component 1 may be limited to at most 0.01. Relative to a white point of (0.30; 0.29) this would result in a relative change of less than 5%.

The multi-component scattering particles 140 may also comprise three or more different materials. If the individual components have a different aging behavior, this allows an even more precise adaptation of the increase in the scattering capability to the temporal and spectral characteristic with which reflectivity of the side walls 101 decreases.

A reduction of the color locus shift, as in the example illustrated, is possible by simultaneous admixture of single-component scattering particles 130 and multi-component scattering particles 140. However, it is also possible to use, for example, exclusively single-component or exclusively multi-component scattering particles. In this case, the scattering particles may all be of the same example, or else consist of particles of different examples. Depending on the application, a suitable number and concentration of differently embodied types of scattering particles may be used in each case.

In addition to scattering particles 130, 140 having a scattering capability that increases with the operating period, further scattering particles having an approximately constant scattering capability may also be embedded into the potting material 110. These scattering particles may comprise, for example, a metal oxide, for instance titanium oxide or aluminum oxide, a metal fluoride, for instance calcium fluoride, or a silicon oxide.

Suitable methods of embedding the conversion particles 120 and scattering particles 130, 140 used in the optoelectronic component 1 would be, for example, an admixture with the still liquid potting material 110 before the latter is introduced into the cavity 100. Alternatively, sedimentation of the conversion particles 120 and/or scattering particles 130, 140 in the already filled, but not yet cured potting material 110 might also be performed. Like the scattering particles 130, 140 the conversion particles 120, too, are preferably admixed with the potting material 110 in a manner distributed uniformly and homogeneously.

The dimensioning of the scattering particles 130, 140 may in principle be chosen freely over a wide range. They are preferably in the range of approximately 1 nm to a few hundred micrometers, even more preferably 10 nm to 10 μm. The scattering particles 130, 140 are thus small enough to be introduced in sufficient numbers into a cavity having dimensions of, for example, a few 100 μm to a few millimeters.

Moreover, the scattering capability in relatively large particles is too low for an effective compensation of a color locus shift. Since the scattering capability is high particularly for scattering particles 130, 140 whose dimensions are smaller than or comparable to the wavelength of the light to be scattered, the size of the scattering particles 130, 140 is preferably adapted to the wavelength of the light component that is principally to be scattered. A lower limit for the size of the single-component scattering particles 130 or multi-component scattering particles 140 is given by the chosen method to fabricate the particles and the optoelectronic component 1.

Instead of filling the cavity 100 with only one potting material 110, as in the example illustrated, it is also possible to introduce a plurality of layers of, for example, potting materials of different types. In this case, the optoelectronic semiconductor chip 10 may also be only partly or not at all in direct contact with one or more of the potting materials. All that is crucial is that the light emitted by the optoelectronic semiconductor chip 10 may emerge from the optoelectronic component 1 through the one or more potting material layers and in the process passes through layers comprising incorporated conversion particles and scattering particles.

In the example illustrated, the optoelectronic semiconductor chip 10 comprises a single emission face 11. However, examples comprising a plurality of emission faces are also possible. To contact the optoelectronic semiconductor chip 10, contact elements 70 establishing an electrical contact with contact pads 13 of the optoelectronic semiconductor chip 10 may be arranged in the optoelectronic component. The contact elements 70 may furthermore, as illustrated, electrically conductively connect to contact pads 106 on the cavity bottom 105 of the cavity 100. However, they may also, for example, in the form of wires, be led out of the cavity 100 and connect to suitable other surfaces or elements. A planar contacting of a contact pad on the underside 12 of the optoelectronic semiconductor chip 10 with a contact pad at the bottom 105 of the cavity of the housing 20 may likewise be performed, for example, by soldering.

The optoelectronic semiconductor chip 10 itself preferably comprises a semiconductor layer stack, into which is embedded an active layer that generates radiation. The active layer may comprise, for example, a pn junction, a double heterostructure or a quantum well structure. To emit electromagnetic radiation in the ultraviolet through the visible to the infrared spectral range, the semiconductor layer stack may contain a III-IV semiconductor material.

In thin-film components, the semiconductor layer stack was at least partly detached from a growth substrate during production. Examples are also possible in which the semiconductor layer stack remains on a substrate, which comprises a transparent material, if appropriate.

The possibility of avoiding a color locus shift of the light emitted by the optoelectronic component 1 as a result of an increasing scattering in the potting material 110 allows a freer selection of the materials for fabricating the housing 20. In particular, it is possible to use materials whose reflectivity decreases as the operating period increases, but which enable, for example, a particularly compact design, enable a particularly simple production of the optoelectronic component 1—for instance using the injection molding or transfer molding method—or are particularly cost-effective. Such suitable materials might be, for example, polyphthalamides, silicones, epoxy materials or silicone-epoxy hybrid materials.

Compact optoelectronic components having high color locus stability may be used, for example, for the backlighting of LCDs, for example, in mobile electronic devices. Typical housing dimensions of such elements are a few 100 micrometers up to a few millimeters.

Although our components have been more specifically illustrated and described in detail by the preferred examples, nevertheless this disclosure is not restricted by the examples disclosed and other variations may be derived therefrom by those skilled in the art, without departing from the scope of protection of the appended claims.

This application claims priority of DE 10 2014 102 258.0, the subject matter of which is incorporated by reference.

The invention claimed is:

1. An optoelectronic component comprising a housing having a cavity in which an optoelectronic semiconductor chip having an emission face that emits light rays and a transparent potting material are arranged,
   wherein the cavity comprises at least one side wall at least partly reflecting light rays incident on the side wall and reflectivity of which decreases as an operating period of the component increases,
   conversion particles are embedded into the potting material, which conversion particles convert light rays having a first wavelength incident on the conversion particles into light rays having a second wavelength, and
   scattering particles are embedded into the potting material, which scattering particles scatter light rays incident on the scattering particles and the scattering capability of which scattering particles increases as the operating period increases.

2. The optoelectronic component according to claim 1, wherein the conversion particles are configured to convert incident light rays having a relatively short wavelength into light rays having a relatively long wavelength.

3. The optoelectronic component according to claim 1, wherein the scattering particles are configured such that a temporal increase in scattering capability is dependent on an effect on the scattering particles manifested by short-wave electromagnetic radiation, UV radiation, and/or heat and/or moisture.

4. The optoelectronic component according to claim 1, wherein the scattering particles are configured to develop hollow spaces or microscopic cracks, that increase the scattering capability as the operating period increases.

5. The optoelectronic component according to claim 1, wherein the scattering particles comprise a silicone or a phenylsilicone.

6. The optoelectronic component according to claim 5, wherein the potting material comprises a silicone or a methylsilicone, having a refractive index of lower than a refractive index of the silicone of the scattering particles.

7. The optoelectronic component according to claim 1, wherein the potting material comprises a silicone or a methylsilicone.

8. The optoelectronic component according to claim 1, wherein the scattering particles comprise a polymer or PMMA.

9. The optoelectronic component according to claim 1, wherein the scattering particles are of multi-component design and comprise a catalyst and a transparent encapsulation,
the encapsulation at least partly surrounds the catalyst, and
the catalyst is configured to support a decomposition of the encapsulation under influence of short-wave electromagnetic radiation, UV radiation, and/or heat and/or moisture.

10. The optoelectronic component according to claim 9, wherein the catalyst comprises $TiO_2$.

11. The optoelectronic component according to claim 9, wherein the encapsulation comprises a polymer.

12. The optoelectronic component according to claim 1, wherein the scattering particles comprise a size of 1 nm to 100 µm.

13. The optoelectronic component according to claim 1, wherein concentration of the scattering particles in the potting material is chosen such that, as the operating period of the optoelectronic component increases, a change in an average path length of a photon in the potting material on account of the decrease in reflectivity of the side wall is counteracted by a simultaneous increase in the scattering capability of the scattering particles, and
the color locus of the radiation emitted by the optoelectronic component changes by at most 5% during a lifetime of the optoelectronic component.

14. The optoelectronic component according to claim 1, wherein the housing comprises a plastic, a polyphthalamide or PCT.

* * * * *